US008308865B2

(12) United States Patent
Kim et al.

(10) Patent No.: US 8,308,865 B2
(45) Date of Patent: *Nov. 13, 2012

(54) SHOWERHEAD FOR CHEMICAL VAPOR DEPOSITION AND CHEMICAL VAPOR DEPOSITION APPARATUS HAVING THE SAME

(75) Inventors: Changsung Sean Kim, Gyunggi-do (KR); Jong Pa Hong, Gyunggi-do (KR); Kyung Ho Lee, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 474 days.

This patent is subject to a terminal disclaimer.

(21) Appl. No.: 12/248,367

(22) Filed: Oct. 9, 2008

(65) Prior Publication Data
US 2009/0266911 A1 Oct. 29, 2009

(30) Foreign Application Priority Data
Apr. 24, 2008 (KR) .................... 10-2008-0038207

(51) Int. Cl.
C23C 16/455 (2006.01)
C23C 16/52 (2006.01)
C23F 1/00 (2006.01)
H01L 21/306 (2006.01)
C23C 16/06 (2006.01)
C23C 16/22 (2006.01)

(52) U.S. Cl. .................. 118/715; 118/724; 156/345.33; 156/345.34; 156/345.37

(58) Field of Classification Search .................. 118/715, 118/725; 156/345.33, 345.34, 345.37
See application file for complete search history.

(56) References Cited

U.S. PATENT DOCUMENTS

| 3,215,508 | A | * | 11/1965 | Piester ........................... 422/143 |
| 4,612,077 | A | * | 9/1986 | Tracy et al. .............. 156/345.34 |
| 5,647,945 | A | * | 7/1997 | Matsuse et al. .......... 156/345.38 |
| 5,741,363 | A | * | 4/1998 | Van Buskirk et al. ........ 118/715 |
| 5,766,364 | A | * | 6/1998 | Ishida et al. .................. 118/725 |
| 5,846,883 | A | * | 12/1998 | Moslehi ......................... 438/711 |
| 5,871,586 | A | * | 2/1999 | Crawley et al. .............. 118/715 |
| 5,935,337 | A | * | 8/1999 | Takeuchi et al. .............. 118/724 |
| 5,950,925 | A | * | 9/1999 | Fukunaga et al. ......... 239/132.3 |
| 5,951,772 | A | * | 9/1999 | Matsuse et al. .......... 118/723 R |
| 5,959,409 | A | * | 9/1999 | Dornfest et al. .......... 315/111.21 |
| 6,176,929 | B1 | * | 1/2001 | Fukunaga et al. ............ 118/715 |
| 6,203,620 | B1 | * | 3/2001 | Moslehi .................. 156/345.35 |

(Continued)

FOREIGN PATENT DOCUMENTS
JP   04033330 A  *  2/1992
(Continued)

OTHER PUBLICATIONS

Korean Office Action, with English Translation, issued in Korean Patent Application No. 10-2008-0038207, dated Mar. 31, 2010.

*Primary Examiner* — Rudy Zervigon
(74) *Attorney, Agent, or Firm* — McDermott Will & Emery LLP

(57) ABSTRACT

A showerhead for chemical vapor deposition (CVD) includes a head storing reaction gas flowing thereinto and feeding the stored reaction gas to a reaction chamber, and at least one support member passing through and coupled with the head and the reaction chamber so as to support the head.

10 Claims, 6 Drawing Sheets

U.S. PATENT DOCUMENTS

| | | | |
|---|---|---|---|
| 6,387,182 B1* | 5/2002 | Horie et al. | 118/244 |
| 6,453,992 B1* | 9/2002 | Kim | 165/206 |
| 6,528,751 B1* | 3/2003 | Hoffman et al. | 219/121.43 |
| 6,894,245 B2* | 5/2005 | Hoffman et al. | 219/121.43 |
| 7,196,283 B2* | 3/2007 | Buchberger et al. | 219/121.43 |
| 7,479,303 B2* | 1/2009 | Byun | 427/248.1 |
| 7,601,933 B2* | 10/2009 | Yoshihara et al. | 219/444.1 |
| 7,674,352 B2* | 3/2010 | Bour et al. | 156/345.34 |
| 7,700,465 B2* | 4/2010 | Collins et al. | 438/513 |
| 7,779,784 B2* | 8/2010 | Chen et al. | 118/723 E |
| 7,803,419 B2* | 9/2010 | Barth et al. | 427/8 |
| 8,069,817 B2* | 12/2011 | Fischer et al. | 118/723 E |
| 8,137,467 B2* | 3/2012 | Meinhold et al. | 118/724 |
| 2003/0047282 A1* | 3/2003 | Sago et al. | 156/345.34 |
| 2004/0050326 A1* | 3/2004 | Thilderkvist et al. | 118/715 |
| 2004/0112542 A1* | 6/2004 | Collins et al. | 156/345.48 |
| 2004/0118519 A1* | 6/2004 | Sen et al. | 156/345.33 |
| 2005/0092248 A1* | 5/2005 | Lee et al. | 118/715 |
| 2006/0263522 A1* | 11/2006 | Byun | 427/248.1 |
| 2007/0163440 A1* | 7/2007 | Kim et al. | 96/52 |
| 2007/0272154 A1* | 11/2007 | Amikura et al. | 118/719 |
| 2008/0053614 A1* | 3/2008 | Sago et al. | 156/345.33 |
| 2008/0156440 A1* | 7/2008 | Sago et al. | 156/345.34 |
| 2008/0242085 A1* | 10/2008 | Fischer et al. | 438/680 |
| 2009/0081878 A1* | 3/2009 | Dhindsa | 438/729 |
| 2009/0095218 A1* | 4/2009 | Meinhold et al. | 118/708 |
| 2009/0095219 A1* | 4/2009 | Meinhold et al. | 118/708 |
| 2009/0095220 A1* | 4/2009 | Meinhold et al. | 118/712 |
| 2009/0095222 A1* | 4/2009 | Tam et al. | 118/723 R |
| 2009/0169744 A1* | 7/2009 | Byun et al. | 427/255.28 |
| 2009/0178615 A1* | 7/2009 | Kim et al. | 118/715 |
| 2009/0178616 A1* | 7/2009 | Byun | 118/715 |
| 2009/0250008 A1* | 10/2009 | Matsushima et al. | 118/728 |
| 2009/0266911 A1* | 10/2009 | Kim et al. | 239/265.11 |
| 2010/0003405 A1* | 1/2010 | Kappeler | 427/255.28 |
| 2010/0263588 A1* | 10/2010 | Zhiyin | 117/98 |
| 2010/0300359 A1* | 12/2010 | Armour et al. | 118/724 |
| 2011/0023782 A1* | 2/2011 | Han | 118/724 |
| 2011/0048325 A1* | 3/2011 | Choi et al. | 118/712 |
| 2011/0052833 A1* | 3/2011 | Hanawa et al. | 427/534 |
| 2011/0146571 A1* | 6/2011 | Bartlett et al. | 118/667 |

FOREIGN PATENT DOCUMENTS

| | | | |
|---|---|---|---|
| JP | 07142401 A | * | 6/1995 |
| JP | 11054440 A | * | 2/1999 |
| KR | 10-0147484 B1 | | 5/1998 |
| KR | 10-2001-0099168 | | 11/2001 |
| KR | 10-2002-0074243 | | 9/2002 |
| KR | 10-2005-0046329 A | | 5/2005 |

\* cited by examiner

SHOWERHEAD FOR CHEMICAL VAPOR DEPOSITION AND CHEMICAL VAPOR DEPOSITION APPARATUS HAVING THE SAME

CROSS-REFERENCE TO RELATED APPLICATIONS

This application claims the priority of Korean Patent Application No. 2008-38207, filed on Apr. 24, 2008, in the Korean Intellectual Property Office, the disclosure of which is incorporated herein by reference.

BACKGROUND OF THE INVENTION

1. Field of the Invention

The present invention relates to a showerhead for chemical vapor deposition (CVD) and a CVD apparatus having the same, and more particularly, to a showerhead for chemical vapor deposition (CVD) improving a structure for spraying reaction gas, and a CVD apparatus having the same.

2. Description of the Related Art

In general, chemical vapor deposition (CVD) is a chemical process in which reaction gas fed into a reaction chamber grows a thin film on the upper surface of a heated wafer through chemical reaction. This thin film growth method is relatively higher in the quality of a grown crystal, but slower in the growth rate of the crystal, compared with a liquid phase growth method. In order to overcome this drawback, a method of simultaneously growing several substrates in a growth cycle is widely used.

A typical CVD apparatus includes a reaction chamber having a predetermined volume of interior space, a susceptor installed in the interior space and mounting a wafer that is a target to be deposited, a heater installed adjacent to the susceptor and applying a predetermined quantity of heat, and a showerhead spraying reaction gas onto the wafer mounted on the susceptor.

SUMMARY OF THE INVENTION

An aspect of the present invention is to provide a showerhead for chemical vapor deposition (CVD) capable of preventing a head from being bent downwards by thermal deformation caused by a temperature difference and its self weight.

An aspect of the present invention is to provide a showerhead for CVD capable of simplifying an assembling process between heads, reducing a time required for the assembling process to improve workability and productivity, and reducing the cost of production.

Another aspect of the present invention is to provide a chemical vapor deposition apparatus capable of reducing a space in which different reaction gases are mixed with each other to lower the height of a reaction chamber, and reducing an entire volume thereof.

According to an aspect of the present invention, there is provided a showerhead for chemical vapor deposition (CVD), which includes a head storing reaction gas flowing thereinto and feeding the stored reaction gas to a reaction chamber, and at least one support member passing through and coupled with the head and the reaction chamber so as to support the head.

Here, the head may include a reservoir storing the reaction gas flowing into the head, and at least one spray nozzle feeding the reaction gas in the reservoir to the reaction chamber.

Further, the head may include a first head storing first reaction gas and spraying the first reaction gas into the reaction chamber, and a second head storing second reaction gas and spraying the second reaction gas into the reaction chamber.

The first head may include a first reservoir storing the first reaction gas, and at least one first spray nozzle feeding the reaction gas in the first reservoir to the reaction chamber. The second head may include at least one second spray nozzle having a predetermined size through which the first spray nozzle passes, and a gas channel formed between the second spray nozzle and the first spray nozzle passing through the second spray nozzle and feeding the second reaction gas in the second reservoir to the reaction chamber.

The gas channel may include a predetermined gap between an inner circumference of the second spray nozzle and an outer circumference of the first spray nozzle.

The first spray nozzle may include a gas pipe having at least one gas spray hole so as to spray the first reaction gas.

Further, the second spray nozzle may include a hole of a predetermined size through which the first spray nozzle passes.

The first spray nozzle may have a substantially same center as the second spray nozzle.

Further, the first spray nozzle may have a lower end that is substantially flush with a lower end of the second spray nozzle.

The support member may include a lower flange on which the head is hooked, a body having the lower flange at a lower end thereof and being shaped of a hollow cylinder, and an upper flange formed at an upper end of the body, and hooked on an outer upper surface of the reaction chamber.

Further, the support members are substantially symmetrical with respect to a center of the head and a center of the reaction chamber.

The showerhead may further include a third head installed above an upper surface of the reaction chamber and forming a cooling water channel, and a cooling water inflow pipe passing through the third head and disposed in the support member such that cooling water flows from an outside into the cooling water channel.

According to an aspect of the present invention, there is provided a chemical vapor deposition apparatus, which includes a reaction chamber, a head storing reaction gas flowing thereinto and feeding the stored reaction gas to the reaction chamber, and at least one support member passing through and coupled with the head and the reaction chamber so as to support the head.

Here, the head may include a reservoir storing the reaction gas flowing into the head, and at least one spray nozzle feeding the reaction gas in the reservoir to the reaction chamber.

Further, the head may include a first head storing first reaction gas and spraying the first reaction gas into the reaction chamber, and a second head storing second reaction gas and spraying the second reaction gas into the reaction chamber.

The first head may include a first reservoir storing the first reaction gas, and at least one first spray nozzle feeding the reaction gas in the first reservoir to the reaction chamber. The second head may include at least one second spray nozzle having a predetermined size through which the first spray nozzle passes, and a gas channel formed between the second spray nozzle and the first spray nozzle passing through the second spray nozzle and feeding the second reaction gas in the second reservoir to the reaction chamber.

Further, the support member may include a lower flange on which the head is hooked, a body having the lower flange at a lower end thereof and being shaped of a hollow cylinder, and an upper flange formed at an upper end of the body, and hooked on an outer upper surface of the reaction chamber.

The support members may be substantially symmetrical with respect to a center of the head and a center of the reaction chamber.

The chemical vapor deposition apparatus may further include a third head installed above an upper surface of the reaction chamber and forming a cooling water channel, and a cooling water inflow pipe passing through the third head and disposed in the support member such that cooling water flows from an outside into the cooling water channel.

According to the exemplary embodiments of the present invention, the support member passes through and is coupled with the head and the reaction chamber, and thereby supports the head. Thus, the showerhead for CVD can prevent the head from being bent downwards by thermal deformation caused by a temperature difference and its self weight.

Further, the heads are assembled such that the gap is formed between the gas pipe of the first head and the hole of the second head. Thus, the s showerhead for CVD can simplify an assembling process between the heads, reduce a time required for the assembling process to improve workability and productivity, and reduce the cost of production.

In addition, the space in which different reaction gases are mixed with each other is reduced to lower a vertical distance between the second head and the susceptor. Thus, the chemical vapor deposition apparatus can lower the height of the reaction chamber to make small-scale design possible, reduce a quantity of consumption of the reaction gas, and secure a uniform flow of the gas to obtain a uniform quality of growth layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EXEMPLARY EMBODIMENTS

Exemplary embodiments of the present invention will now be described in detail with reference to the accompanying drawings.

Figure 1A:
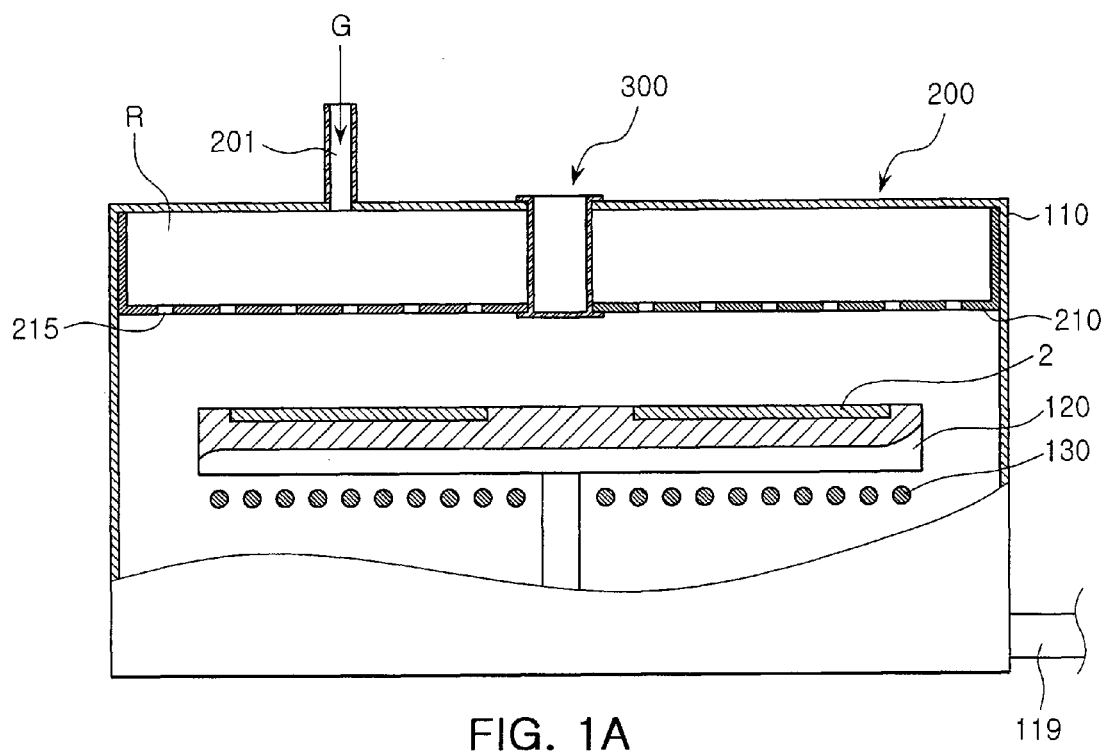
FIG. 1A is a cross-sectional view illustrating a chemical vapor deposition (CVD) apparatus having a showerhead for CVD according to an exemplary embodiment of the present invention.
Figure 1B:
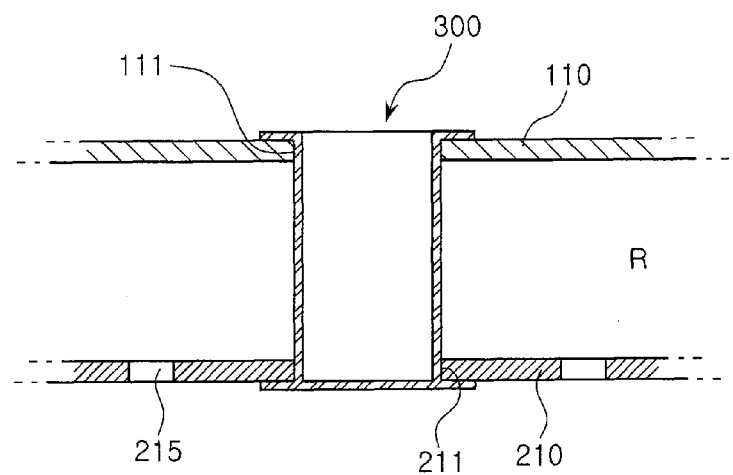
FIG. 1B is an enlarged cross-sectional view illustrating the showerhead of FIG. 1A.
Figure 2:
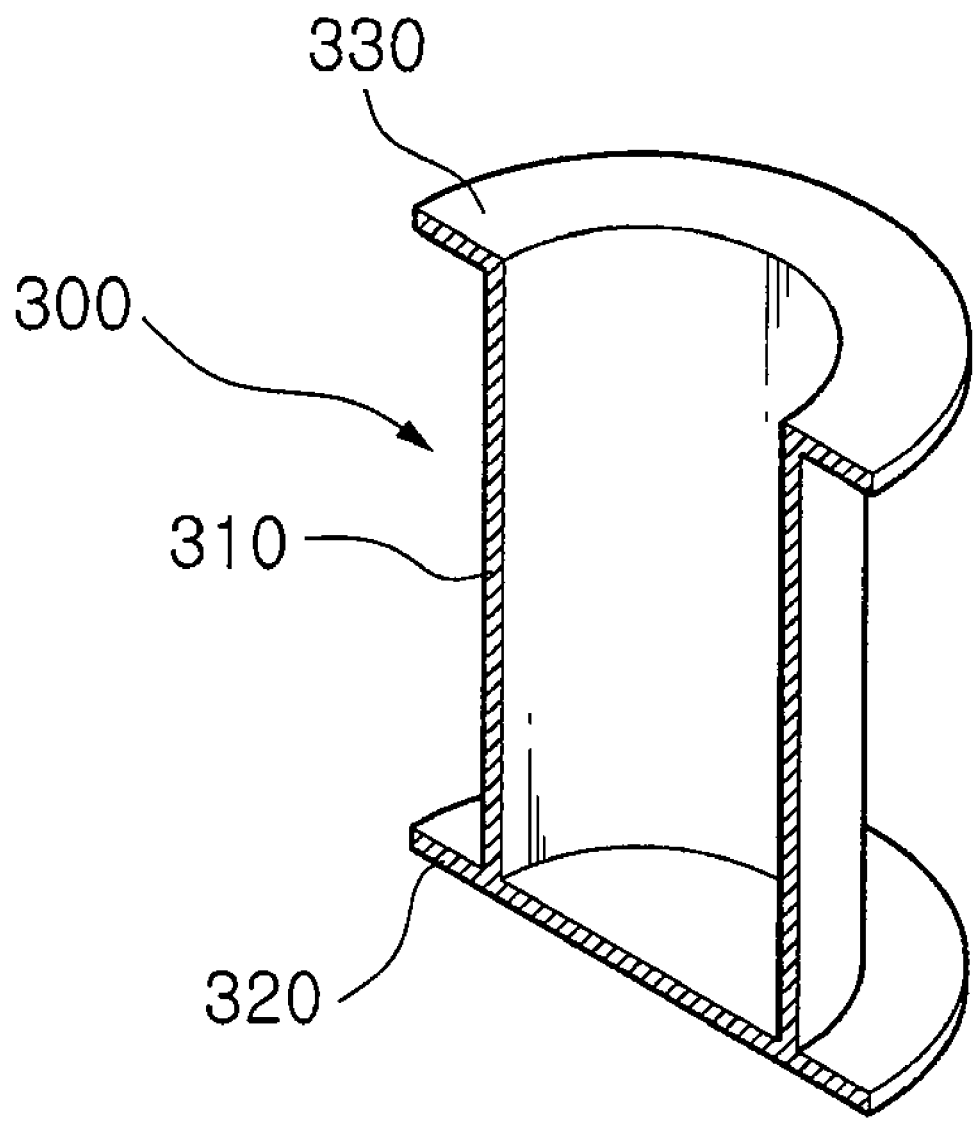
FIG. 2 is a perspective view illustrating the support member of FIG. 1.
Figure 3A:
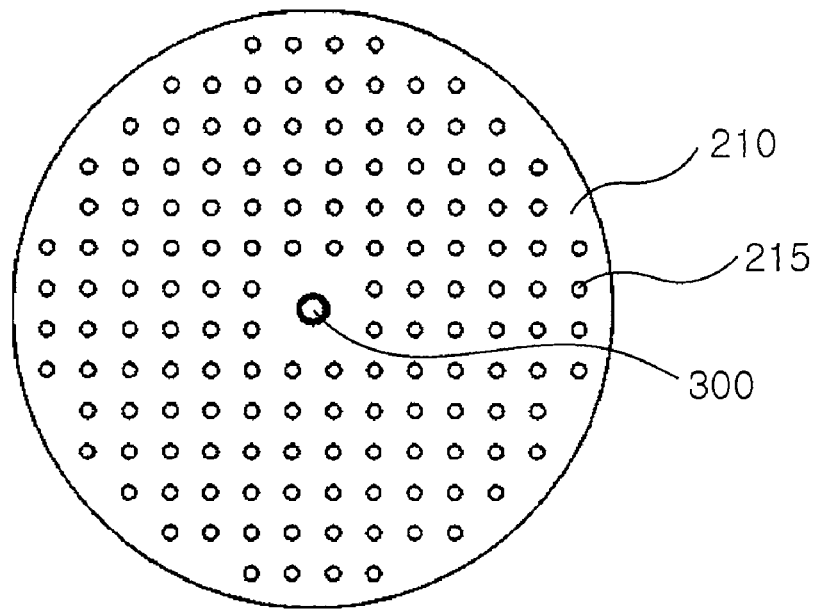
FIG. 3A is a bottom view illustrating one state in which the support member and the showerhead of FIG. 1 are coupled to each other.
Figure 3B:
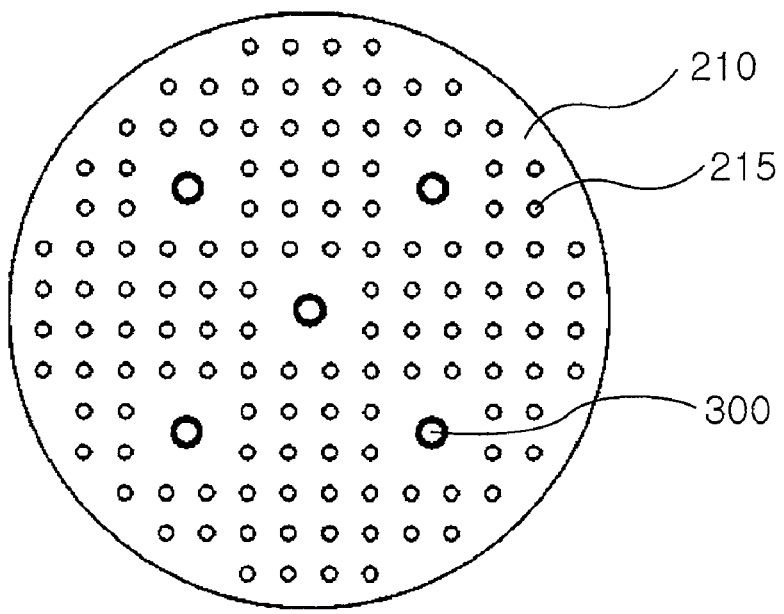
FIG. 3B is a bottom view illustrating another state in which the support member and the showerhead of FIG. 1 are coupled to each other.

FIG. 1A is a cross-sectional view illustrating a chemical vapor deposition (CVD) apparatus having a showerhead for CVD according to an exemplary embodiment of the present invention, and FIG. 1B is an enlarged cross-sectional view illustrating the showerhead of FIG. 1A. FIG. 2 is a perspective view illustrating the support member of FIG. 1. FIG. 3A is a bottom view illustrating one state in which the support member and the showerhead of FIG. 1 are coupled to each other, and FIG. 3B is a bottom view illustrating another state in which the support member and the showerhead of FIG. 1 are coupled to each other.

As illustrated in FIGS. 1-3, the CVD apparatus according to an embodiment of the present invention includes a reaction chamber 110, a susceptor 120, a heater 130, and a showerhead 200.

The reaction chamber 110 has a predetermined volume of interior space such that chemical vapor reaction takes place between reaction gas flowing into the interior space and at least one wafer 2 that is a target to be deposited. The reaction chamber 110 may be provided with a heat insulator on an inner surface thereof so as to be able to withstand a high-temperature atmosphere.

This reaction chamber 110 is provided with a discharge port 119, which discharges waste gases undergoing the chemical vapor reaction with the wafer 2 to the outside.

The susceptor 120 is a wafer supporting structure that has at least one concave pocket, in which the wafer 2 is placed, in the upper surface thereof and is disposed in the reaction chamber 110.

This susceptor 120 is shaped of a disc made of graphite, and at the center of the lower surface of which a rotary shaft connected with a driving motor (not shown) is located. Thus, the susceptor 120, in which the wafer 2 is placed, can be rotated in one direction at a uniform speed from about 5 rpm to about 50 rpm by the force of rotation of the driving motor.

The heater 130 is disposed adjacent to the lower surface of the susceptor 120, in which the wafer 2 is placed. Thereby, the heater 130 supplies heat to the susceptor 120, and thus heats the wafer 2.

This heater 130 includes one selected from among an electric heater, a high-frequency induction heater, an infrared radiation heater, a laser, and so forth.

Preferably, the reaction chamber 110 is provided with a temperature sensor (not shown), which is disposed adjacent to an outer surface of the susceptor 120 or the heater 130, so as to be able to measure interior atmosphere temperature of the reaction chamber 110 at any time and then adjust heating temperature on the basis of the measured values.

Meanwhile, the showerhead 200 is a structure that is installed on an upper portion of the reaction chamber 110 such that at least one kind of reaction gas is sprayed onto the wafer 2 placed in the susceptor 120 and can be uniformly contact the wafer 2. This showerhead 120 includes a head 210 and a support member 300.

The head 210 of the showerhead 120 includes at least one reservoir R, which is connected with a feed line 201 through which the reaction gas G is fed from the outside, and in an interior space of which the fed reaction gas G is filled and stored.

This head 210 is provided with a plurality of spray nozzles 215 on a lower surface thereof. The reaction gas G in the reservoir R is sprayed into the reaction chamber 110 through the spray nozzles 215.

The support member 300 is coupled with the head 210 and the reaction chamber 110 across the reservoir R, and supports the head 210, thereby preventing the head 210 from being bent downwards by thermal deformation and its self weight under the high-temperature atmosphere in the reaction chamber 110.

At this time, the head 210 and the reaction chamber 110 are provided with through-holes 111 and 211 having a predetermined size respectively such that the support member 300 can pass through the head 210 and the reaction chamber 110 when coupled with the head 210 and the reaction chamber 110. Preferably no gap is formed between the support member 300 and the head 210, and between the support member 300 and the reaction chamber 110.

The support member 300 will be described in greater detail with reference to FIG. 2.

As illustrated in FIG. 2, the support member 300 includes a cylindrical body 310, and an upper flange 330 and a lower flange 320, which are formed on upper and lower ends of the cylindrical body 310.

The body 310 of the support member 300 is shaped of a hollow cylinder having a predetermined length, and is inserted into the through-holes 111 and 211 of the head 210 and the reaction chamber 110 when coupled with the head 210 and the reaction chamber 110. In the embodiment of the present invention, it has been described that the body 310 of the support member 300 has a cylindrical shape. However, the present invention is not limited to this configuration.

Here, preferably, the body 310 of the support member 300 has a substantially same diameter as each of the through-holes 111 and 211 such that no gap is formed between the support member 300 and the head 210, and between the support member 300 and the reaction chamber 110. Alternatively, the gap between the body 310 of the support member 300 and the through-holes 111 and 211 may be sealed by sealing members (not shown).

The lower flange 320 is formed on the lower end of the body 310 of the support member 300, and particularly, protrudes from the lower end of the body 310 of the support member 300 in a radial direction such that a lower surface of the head 210 facing the susceptor 120 is hooked on the lower flange 320. Thus, the lower flange 310 has a diameter greater than that of the body 310 of the support member 300.

Further, the upper flange 330 is formed on the upper end of the body 310 of the support member 300, and particularly, protrudes from the upper end of the body 310 of the support member 300 in a radial direction such that the upper flange 330 is hooked on an outer upper surface of the reaction chamber 110. Thus, the upper flange 330 has a diameter greater than that of the body 310 of the support member 300.

Thus, the head 210 is hooked on the reaction chamber 110 by the support member 300 coupled with the head 210 and the reaction chamber 110. Thereby, it is possible to prevent the head 210 from being bent downwards.

As illustrated in FIGS. 3 A and B, one support member 300 is located at the center of the head 210, or multiple support members 300 are disposed so as to have point symmetry with respect to the center of the head 210. The embodiment of the present invention is not limited to this configuration. Thus, the support members 300 are preferably disposed so as to be substantially symmetrical with respect to the centers of the head 210 and the reaction chamber 110.

Figure 4A:
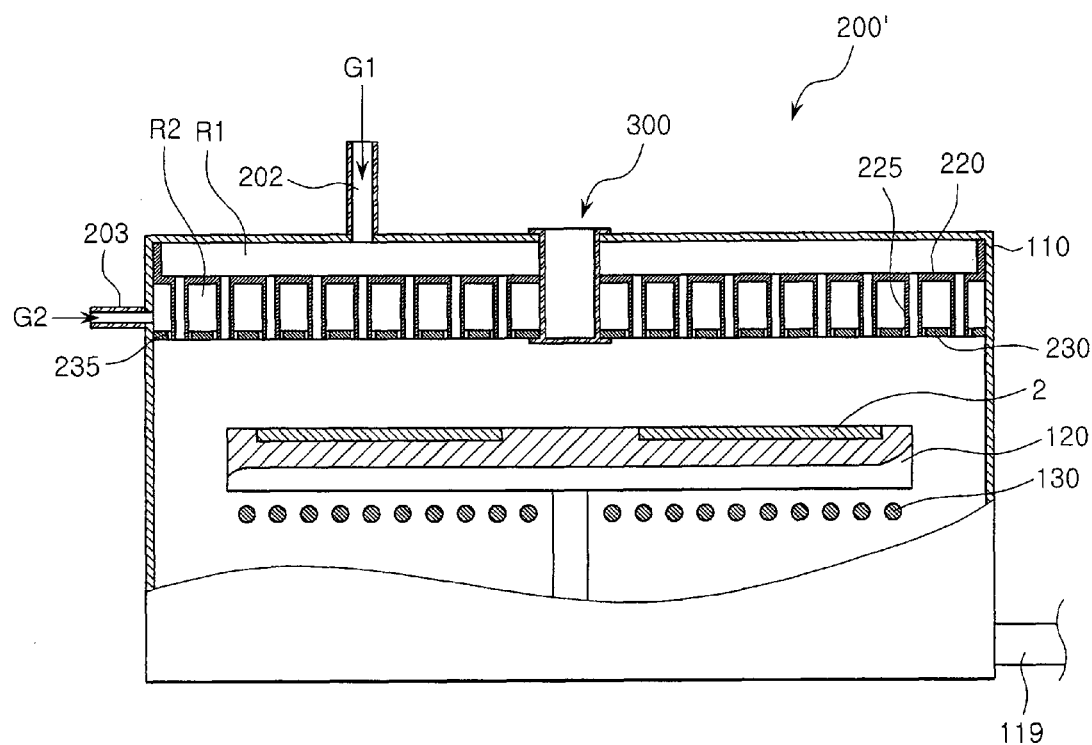
FIG. 4A is a cross-sectional view illustrating a CVD apparatus having a showerhead for CVD according to another exemplary embodiment of the present invention.
Figure 4B:
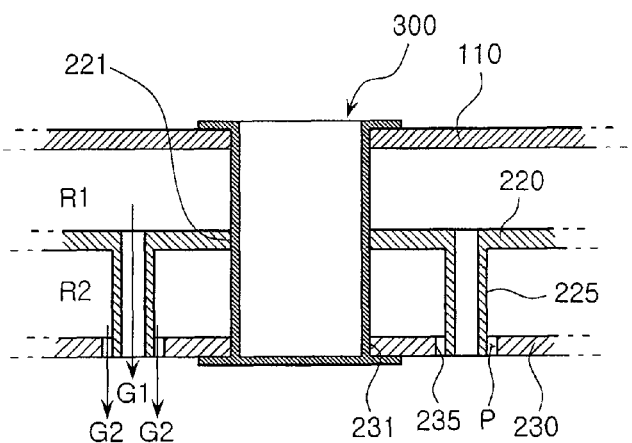
FIG. 4B is an enlarged cross-sectional view illustrating the showerhead of FIG. 4A.
Figure 5:
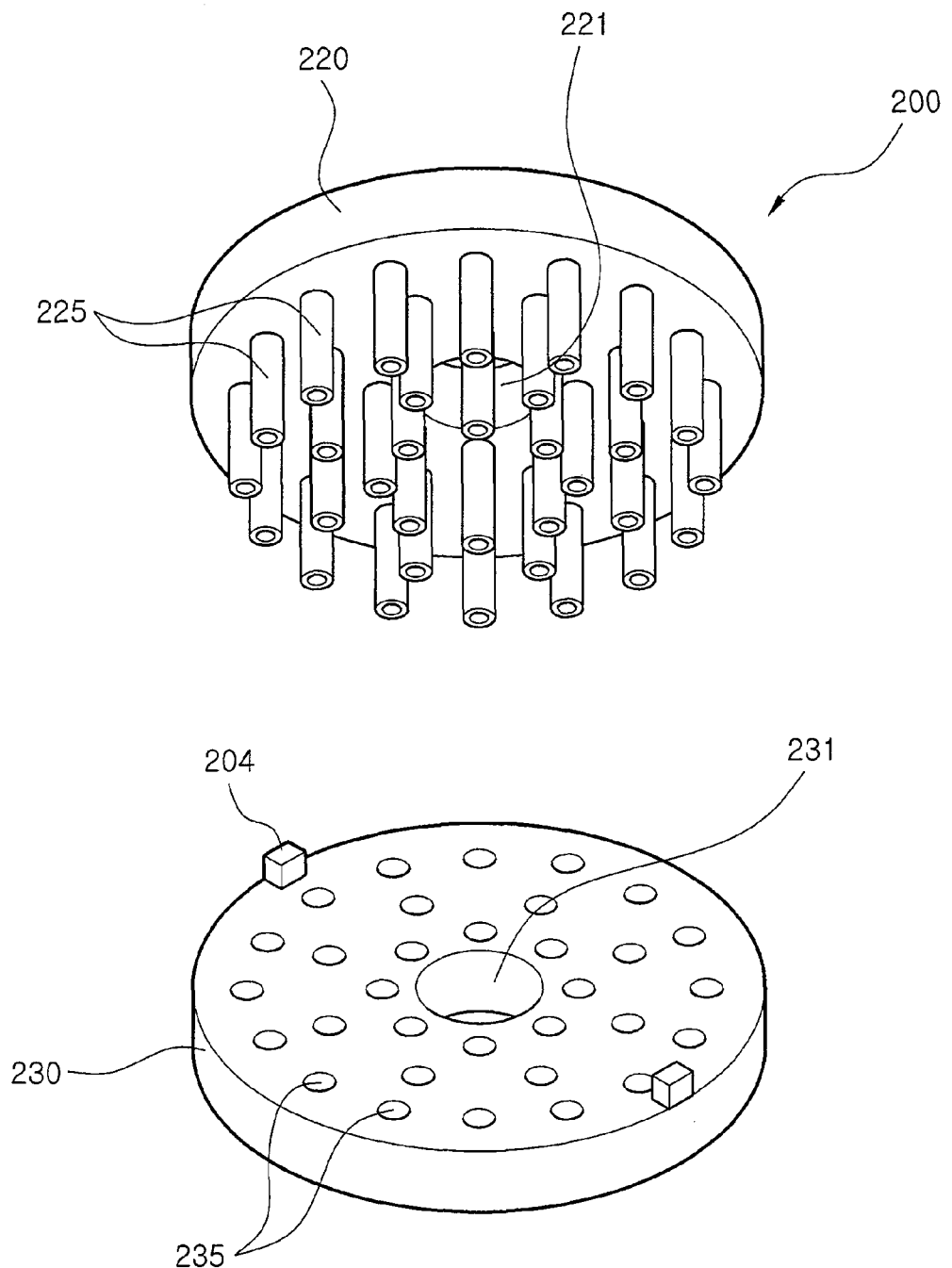
FIG. 5 is a perspective view illustrating the showerhead of FIG. 4.

Meanwhile, FIGS. 4 and 5 are cross-sectional views illustrating a showerhead for CVD according to another embodiment of the present invention. As illustrated in FIG. 4, the showerhead 200' for CVD according to another embodiment of the present invention includes a first head 220 and a second head 230.

The first head 220 of the showerhead 200' includes a first reservoir R1, which is connected with a first feed line 202 through which first reaction gas G1 is fed, and in an interior space of which the first reaction gas G1 is filled and stored through the first feed line 202.

The first head 220 is provided with one or more first spray nozzles 225 having a predetermined length on a lower surface thereof. The first reaction gas G1 in the first reservoir R1 is sprayed into the reaction chamber 110 through the first spray nozzles 225.

Here, each of the first spray nozzles 225 is preferably formed of a gas pipe having at least one gas spray hole so as to spray the first reaction gas G1.

FIGS. 4 and 5 show the configuration in which the first head 220 has the plurality of first spray nozzles 225, and is installed at the upper portion of the reaction chamber 110.

The second head 230 is disposed below the first head 220 so as to face the susceptor 120, and is spaced apart from the first head 220 by spacers 204 so as to have a vertical gap, thereby defining a second reservoir R2 having a predetermined volume of interior space.

The second reservoir R2 communicates with a second feed line 203, through which second reaction gas G2 flows to be filled and stored in the interior space of the second reservoir R2.

As illustrated in FIG. 5, the second head 230 is provided with second spray nozzles 235 having a predetermined size. A predetermined gap is formed between an outer circumference of each of the first spray nozzles 225 and an inner circumference of each of the second spray nozzles 235 such that the first spray nozzles 225 pass through the respective second spray nozzles 235.

Here, each of the second spray nozzles 235 is formed of a predetermined size of hole, through which the gas pipe of each of the first spray nozzles 225 passes. The number of second spray nozzles 235 is preferably equal to the number of first spray nozzles 225 of the first head 220.

Thus, the gaps formed between the first spray nozzles 225 and the second spray nozzles 235 through which the first spray nozzles 225 pass function as gas channels P that enable the second reaction gas G2 in the second reservoir R2 to be sprayed into the reaction chamber 110.

Thus, the first reaction gas G1, which is fed through the first feed line 202 and then is stored in the first reservoir R1, is sprayed into the reaction chamber 110 through the gas pipes of the first spray nozzles 225. Further, the second reaction gas G2, which is fed through the second feed line 203 and then is stored in the second reservoir R2, is sprayed into the reaction chamber 110 through the gas channels P. Thereby, the first and second reaction gases R1 and R2 are mixed with each other in the interior space of the reaction chamber 110 located under the first and second spray nozzles 225 and 235.

Preferably, each of the first spray nozzles 225 has a substantially same center as each of the second spray nozzles 235. Thereby, the second reaction gas G2 can be more uniformly sprayed through the gas channels P.

Further, a lower end of each of the first spray nozzles 225 and a lower end of each of the second spray nozzles 235 are substantially flush with the lower surface of the second head 230. Thereby, the second reaction gas G2 sprayed through the gas channels P can be more uniformly mixed with the first reaction gas G1 sprayed through the first spray nozzles 225.

As in the aforementioned embodiment of FIG. 1, the support member 300 passes through the through-hole 111 of the reaction chamber 110, through-holes 221 and 231 of the first and second heads 220 and 230 when coupled with the reaction chamber 110 and the first and second heads 220 and 230.

In this case, the lower surface of the second head 230 is hooked on the lower flange 320 of the support member 300 is hooked on. The body 310 of the support member 300 passes through the first head 220. The upper flange 330 of the support member 300 is hooked on the outer upper surface of the second head 230.

Thereby, each of the first spray nozzles 225 can be maintained so as to have the substantially same center as each of the second spray nozzles 235, and the first and second heads 220 and 230 can be prevented from being bent downwards.

Figure 6A:
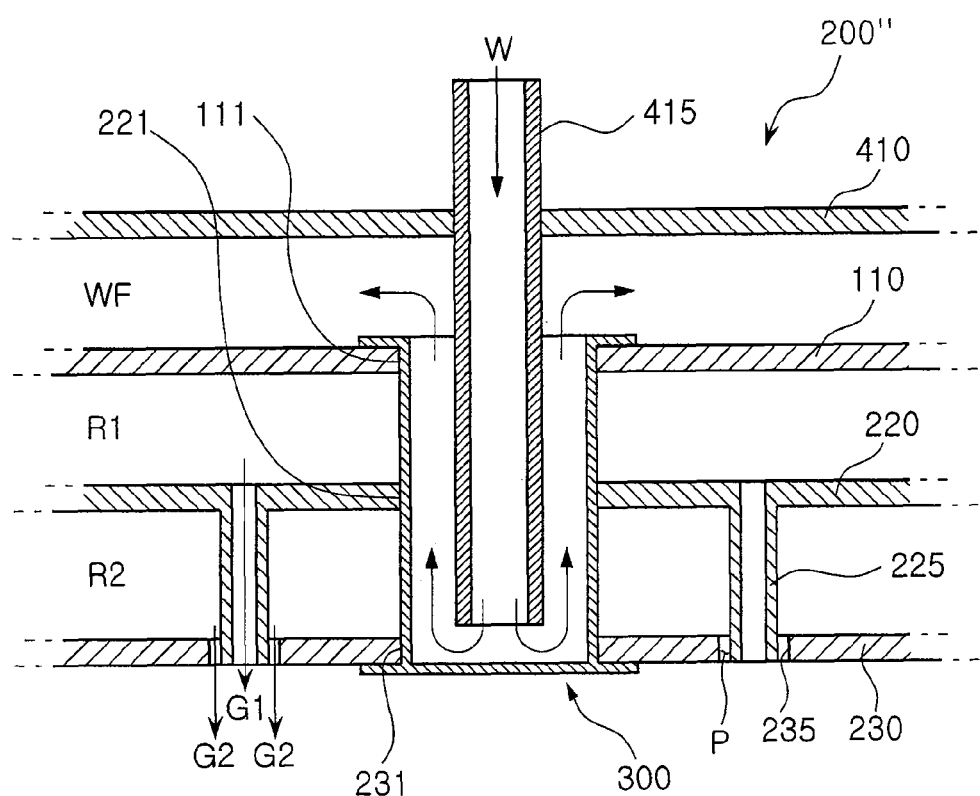
FIG. 6A is an enlarged cross-sectional view illustrating a showerhead for CVD according to another exemplary embodiment of the present invention.
Figure 6B:
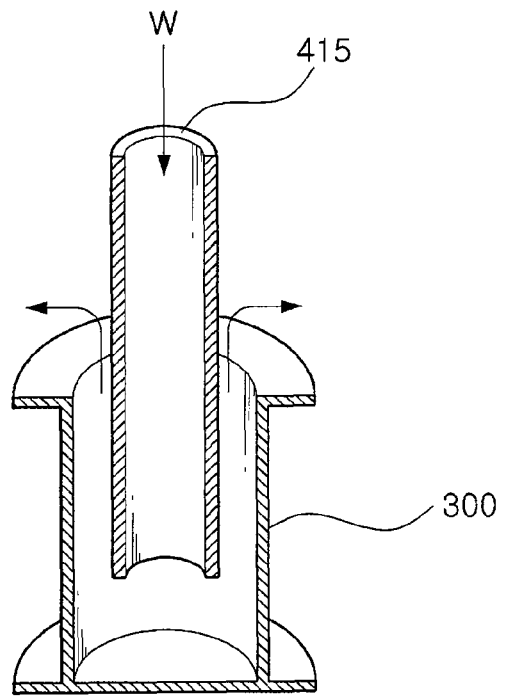
FIG. 6B is an enlarged cross-sectional view illustrating the state in which a cooling water inflow pipe is coupled to the support member of FIG. 6A.

Meanwhile, FIG. 6 is a cross-sectional view illustrating a showerhead for CVD according to another embodiment of the present invention. As illustrated in FIG. 6, the showerhead 200" for CVD according to another embodiment of the present invention includes a first head 220, a second head 230, a third head 410, and a cooling water inflow pipe 415.

In this embodiment, the first and second heads 220 and 230 are equal to those described with reference to FIGS. 4 and 5, and so a repeated description is omitted compared with the aforementioned embodiment. Thus, the configuration of the third head 410 and the cooling water inflow pipe 415 will be mainly described.

As illustrated in FIG. 6, the third head 410 is installed above the outer upper surface of the reaction chamber 110. Thus, a cooling water channel WF having a predetermined volume of space is defined between the third head 410 and the reaction chamber 110.

In the exemplary embodiment of the present invention, it has been described that the third head 410 is installed above the outer upper surface of the reaction chamber 110. However, the present invention is not limited to this configuration. For example, the third head 410 may be provided between the first head 220 and the reaction chamber 110. In this case, the upper flange 330 of the support member 300 is hooked on the outer upper surface of the reaction chamber 110.

The cooling water inflow pipe 415 passes through the third head 410 and the cooling water channel WF, and then is located in the support member 300 such that cooling water W flows from the outside into the cooling water channel WF.

At this time, preferably, the cooling water inflow pipe 415 is substantially located at the center of the interior of the support member 300, and is spaced apart from the lower end of the support member 300 such that the cooling water W flows from the support member 300 to the cooling water channel WF, and then is discharged to the outside.

Thus, the first reaction gas G1 in the first reservoir R1, which is heated by the high-temperature atmosphere in the reaction chamber 110, is cooled by the cooling water flowing through the cooling water. Thereby, it is possible to prevent parasitic deposition caused by chemical reaction.

While the present invention has been shown and described in connection with the exemplary embodiments, it will be apparent to those skilled in the art that modifications and variations can be made without departing from the spirit and scope of the invention as defined by the appended claims.

What is claimed is:

1. A showerhead for chemical vapor deposition comprising:
   a head storing reaction gas flowing thereinto and feeding the stored reaction gas to a reaction chamber; and
   at least one support member passing through and coupled with the head and an upper surface of the reaction chamber so as to support the head inside the reaction chamber and prevent the head from being bent downwards,
   wherein the head includes:
   a first head storing first reaction gas and spraying the first reaction gas downwards into the reaction chamber, the first head includes a first reservoir storing the first reaction gas, and at least one first spray nozzle feeding the reaction gas in the first reservoir to the reaction chamber;
   a second head storing second reaction gas and spraying the second reaction gas downwards into the reaction chamber, the second head includes a second reservoir storing the second reaction gas, and at least one second spray nozzle having a predetermined size through which the first spray nozzle passes, and a gas channel formed between the second spray nozzle and the first spray nozzle passing through the second spray nozzle and feeding the second reaction gas in the second reservoir to the reaction chamber;
   a third head installed above the upper surface of the reaction chamber, defining the first reservoir with the first head, and forming a cooling water channel between the third head and the upper surface of the reaction chamber; and
   a cooling water inflow pipe passing through the third head and disposed in the support member such that cooling water flows from an outside into the cooling water channel,
   wherein the gas channel includes a predetermined gap between an inner circumference of the second spray nozzle and an outer circumference of the first spray nozzle.

2. The showerhead of claim 1, wherein the first spray nozzle includes a gas pipe having at least one gas spray hole so as to spray the first reaction gas.

3. The showerhead of claim 1, wherein the second spray nozzle includes a hole of a predetermined size through which the first spray nozzle passes.

4. The showerhead of claim 1, wherein the first spray nozzle has a substantially same center as the second spray nozzle.

5. The showerhead of claim 1, wherein the first spray nozzle has a lower end that is substantially flush with a lower end of the second spray nozzle.

6. The showerhead of claim 1, wherein the support member includes:
   a lower flange on which a bottom surface of the head is hooked;
   a body having the lower flange at a lower end thereof and being shaped of a hollow cylinder; and
   an upper flange formed at an upper end of the body, and hooked on an outer upper surface of the reaction chamber.

7. The showerhead of claim 1, wherein the support member is substantially symmetrical with respect to a center of the head and a center of the reaction chamber.

8. A chemical vapor deposition apparatus comprising:
a reaction chamber;
a head storing reaction gas flowing thereinto and feeding the stored reaction gas to the reaction chamber; and
at least one support member passing through and coupled with the head and an upper surface of the reaction chamber so as to support the head inside the reaction chamber and prevent the head from being bent downwards,
wherein the head includes:
a first head storing first reaction gas and spraying the first reaction gas downwards into the reaction chamber, the first head includes a first reservoir storing the first reaction gas, and at least one first spray nozzle feeding the reaction gas in the first reservoir to the reaction chamber;
a second head storing second reaction gas and spraying the second reaction gas downwards into the reaction chamber, the second head includes a second reservoir storing the second reaction gas, and at least one second spray nozzle having a predetermined size through which the first spray nozzle passes, and a gas channel formed between the second spray nozzle and the first spray nozzle passing through the second spray nozzle and feeding the second reaction gas in the second reservoir to the reaction chamber;
a third head installed above the upper surface of the reaction chamber, defining the first reservoir with the first head, and forming a cooling water channel between the third head and the upper surface of the reaction chamber; and
a cooling water inflow pipe passing through the third head and disposed in the support member such that cooling water flows from an outside into the cooling water channel,
wherein the gas channel includes a predetermined gap between an inner circumference of the second spray nozzle and an outer circumference of the first spray nozzle.

9. The chemical vapor deposition apparatus of claim 8, wherein the support member includes:
a lower flange on which a bottom surface of the head is hooked;
a body having the lower flange at a lower end thereof and being shaped of a hollow cylinder; and
an upper flange formed at an upper end of the body, and hooked on an outer upper surface of the reaction chamber.

10. The chemical vapor deposition apparatus of claim 8, wherein the support member is substantially symmetrical with respect to a center of the head and a center of the reaction chamber.

* * * * *